United States Patent
Nagaoka et al.

(10) Patent No.: US 11,515,146 B2
(45) Date of Patent: Nov. 29, 2022

(54) METHOD OF FORMING GALLIUM OXIDE FILM

(71) Applicants: Tatsuji Nagaoka, Nagakute (JP); Hiroyuki Nishinaka, Kyoto (JP); Masahiro Yoshimoto, Kyoto (JP)

(72) Inventors: Tatsuji Nagaoka, Nagakute (JP); Hiroyuki Nishinaka, Kyoto (JP); Masahiro Yoshimoto, Kyoto (JP)

(73) Assignees: DENSO CORPORATION, Kariya (JP); NATIONAL UNIVERSITY CORPORATION KYOTO INSTITUTE OF TECHNOLOGY, Kyoto (JP)

( * ) Notice: Subject to any disclaimer, the term of this patent is extended or adjusted under 35 U.S.C. 154(b) by 430 days.

(21) Appl. No.: 16/697,273

(22) Filed: Nov. 27, 2019

(65) Prior Publication Data
US 2020/0194256 A1    Jun. 18, 2020

(30) Foreign Application Priority Data

Dec. 17, 2018   (JP) .............................. JP2018-235359

(51) Int. Cl.
*H01L 21/02*    (2006.01)

(52) U.S. Cl.
CPC .. *H01L 21/02175* (2013.01); *H01L 21/02205* (2013.01); *H01L 21/02403* (2013.01)

(58) Field of Classification Search
None
See application file for complete search history.

(56) References Cited

U.S. PATENT DOCUMENTS

| 5,102,512 A | 4/1992 | Lamerant |
| 2015/0187573 A1* | 7/2015 | Chiou ..................... H01L 29/22 257/43 |
| 2017/0278706 A1 | 9/2017 | Oda et al. |

FOREIGN PATENT DOCUMENTS

| JP | 64-4435 A | 1/1989 |
| JP | 11-157836 A | 6/1999 |
| JP | 2016-079485 A | 5/2016 |
| JP | 2016-207911 A | 12/2016 |
| WO | WO2010140548 | * 12/2010 | ....... C04B 35/62675 |
| WO | WO2016013554 | * 1/2016 | ............ H01L 29/04 |
| WO | 2016/035696 A1 | 3/2016 |

OTHER PUBLICATIONS

Kim et al., "Optical properties of β-Ga₂O₃ and α-Ga₂O₃:Co thin films grown by spray pyrolysis", Journal of Applied Physics, 1987, vol. 62, No. 5, pp. 2000-2002 (10 pages total).

* cited by examiner

*Primary Examiner* — Alexander G Ghyka
(74) *Attorney, Agent, or Firm* — Sughrue Mion, PLLC

(57) ABSTRACT

A method of forming a gallium oxide film is provided, and the method may include supplying mist of a material solution comprising gallium atoms and chlorine atoms to a surface of a substrate while heating the substrate so as to form the gallium oxide film on the surface of the substrate, in which a molar concentration of chlorine in the material solution is equal to or more than 3.0 times and equal to or less than 4.5 times a molar concentration of gallium in the material solution.

7 Claims, 1 Drawing Sheet

METHOD OF FORMING GALLIUM OXIDE FILM

CROSS-REFERENCE TO RELATED APPLICATION(S)

This application claims priority to Japanese Patent Application No. 2018-235359, filed on Dec. 17, 2018, the entire contents of which are incorporated herein by reference.

TECHNICAL FIELD

The technology disclosed herein relates to a method of forming a gallium oxide film.

BACKGROUND

Japanese Patent Application Publication No. 2016-079485 discloses a method of forming a gallium oxide film on a substrate. This film formation method includes supplying mist of a material solution in which gallium halide and hydrochloric acid are mixed to a surface of the substrate while heating the substrate. The gallium oxide film can thereby be formed on the substrate.

SUMMARY

If a gallium oxide film formed on a substrate is used as a semiconductor element, its surface roughness greatly influences characteristics of the semiconductor element. Preferably, the gallium oxide film has a smooth surface. The present specification proposes a film formation method capable of forming a gallium oxide film having a smooth surface.

A film formation method disclosed herein may comprise supplying mist of a material solution containing gallium atoms and chlorine atoms to a surface of a substrate while heating the substrate so as to form a gallium oxide film on the surface of the substrate. A molar concentration of chlorine in the material solution is equal to or more than 3.0 times and equal to or less than 4.5 times a molar concentration of gallium in the material solution.

Experiments revealed that when the molar concentration of chlorine in the material solution is controlled to be equal to or more than 3.0 times and equal to or less than 4.5 times the molar concentration of gallium in the material solution, the formed gallium oxide film has an extremely low surface roughness. According to this film formation method, therefore, a gallium oxide film having a smooth surface can be formed.

DETAILED DESCRIPTION

Figure 1:
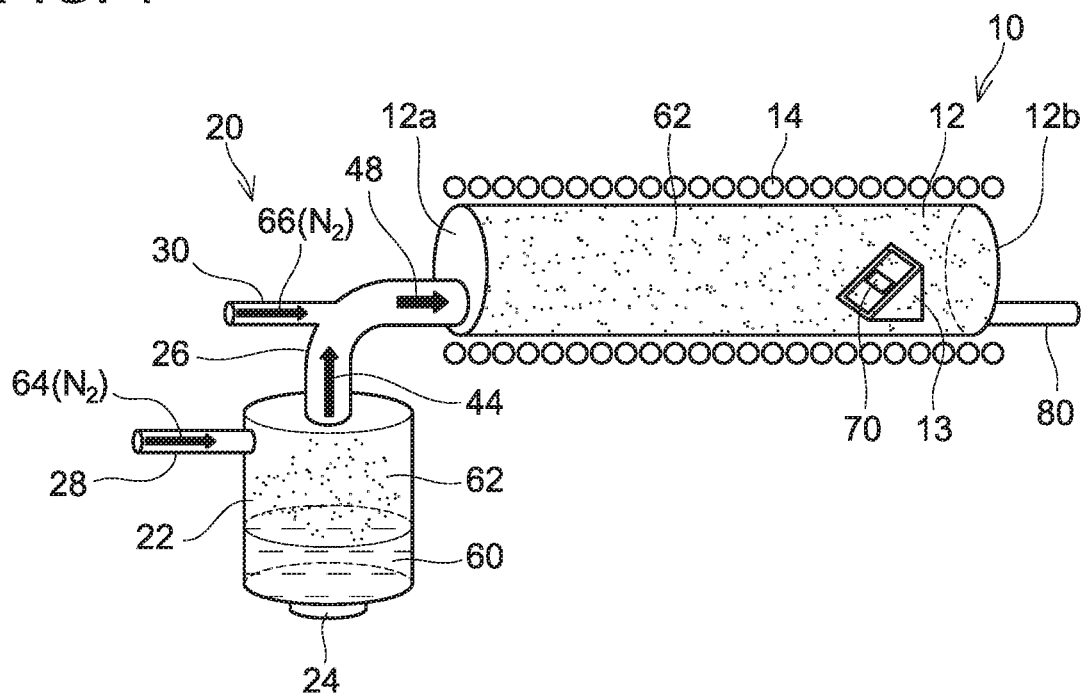
FIG. 1 is a configuration diagram of a film formation apparatus 10.

A film formation apparatus 10 shown in FIG. 1 is an apparatus configured to form a gallium oxide film on a substrate 70 having a plate shape. The film formation apparatus 10 comprises a furnace 12 in which the substrate 70 is placed, a heater 14 configured to heat the furnace 12, a mist supply device 20 connected to the furnace 12, and an exhaust pipe 80 connected to the furnace 12.

A specific configuration of the furnace 12 is not limited to a particular one. As an example, the furnace 12 shown in FIG. 1 is a tubular furnace extending from an upstream end 12a to a downstream end 12b. The mist supply device 20 is connected to the upstream end 12a of the furnace 12. The exhaust pipe 80 is connected to the downstream end 12b of the furnace 12.

Provided in the furnace 12 is a substrate stage 13 for supporting the substrate 70. The substrate stage 13 is configured such that the substrate 70 is tilted relative to a longitudinal direction of the furnace 12. The substrate 70 supported by the substrate stage 13 is supported in an orientation that allows mist flowing through the furnace 12 from the upstream end 12a toward the downstream end 12b to be applied onto a surface of the substrate 70.

As mentioned before, the heater 14 is configured to heat the furnace 12. A specific configuration of the heater 14 is not limited to a particular one. As an example, the heater 14 shown in FIG. 1 is an electric heater, and is placed along an outer peripheral wall of the furnace 12. The heater 14 thereby heats the outer peripheral wall of the furnace 12, so that the substrate 70 in the furnace 12 is heated.

The mist supply device 20 supplies mist of a solution containing a material of a gallium oxide film into the furnace 12. A specific configuration of the mist supply device 20 is not limited to a particular one. As an example, the mist supply device 20 shown in FIG. 1 comprises a container 22 storing a material solution 60, an ultrasonic transducer 24 provided on the container 22, a mist supply path 26 connecting the container 22 and the furnace 12, a carrier gas introduction path 28 connected to the container 22, and a diluent gas introduction path 30 connected to the mist supply path 26. The carrier gas introduction path 28 supplies carrier gas 64 to the container 22. The diluent gas introduction path 30 supplies diluent gas 66 to the mist supply path 26. The ultrasonic transducer 24 applies ultrasonic vibration to the material solution 60 in the container 22 so as to create mist 62 of the material solution 60.

The exhaust pipe 80 is connected to the downstream end 12b of the furnace 12. The mist 62 that has been supplied into the furnace 12 by the mist supply device 20 flows through the furnace 12 to the downstream end 12b, and is then discharged to an outside of the furnace 12 via the exhaust pipe 80.

Next, a film formation method in an embodiment will be described. The film formation method in the embodiment includes a material solution-creating step of creating a material solution, and a film-forming step of using the created material solution and the film formation apparatus 10 so as to form a gallium oxide film.

In the material solution-creating step, a material solution containing gallium atoms and chlorine atoms is created. The material solution can be created by various methods.

In a first method of creating the material solution, powder of gallium chloride ($GaCl_3$, $Ga_2Cl_6$) is dissolved in pure water so as to create the material solution. Here, to adjust a molar concentration of chlorine in the material solution, hydrochloric acid may be added to the material solution. Since gallium chloride has a low boiling point among gallium halides, gallium chloride of a high purity can easily be created through distillation.

In a second method of creating the material solution, powder of elemental gallium is dissolved in hydrochloric acid so as to create the material solution.

In a third method of creating the material solution, gallium hydroxide (Ga(OH)$_3$) is dissolved in hydrochloric acid so as to create the material solution.

In a fourth method of creating the material solution, gallium oxyhydroxide (GaOOH) is dissolved in hydrochloric acid so as to create the material solution.

With any of the first to fourth methods, the material solution containing gallium atoms and chlorine atoms can be created. The material solution may be created by any of the first to fourth methods, or may be created by another method. In the material solution-creating step, the molar concentration of gallium and the molar concentration of chlorine in the material solution can be freely modified. In the present embodiment, preferably, the molar concentration of chlorine in the material solution is set to be equal to or more than 3.0 times and equal to or less than 4.5 times the molar concentration of gallium in the material solution. More preferably, the molar concentration of chlorine in the material solution is set to be equal to or less than 3.5 times the molar concentration of gallium in the material solution. Moreover, a material for adding an n-type or p-type dopant to the gallium oxide film may be added to the material solution.

In the film-forming step, the material solution, which was created in the material solution-creating step, is set to the film formation apparatus 10 shown in FIG. 1, and a gallium oxide film is grown on the substrate 70 by the film formation apparatus 10. In the present embodiment, a substrate constituted of a single crystal of β-gallium oxide (β-Ga$_2$O$_3$) in which a (010) crystal plane is exposed on a surface thereof is used as the substrate 70. Moreover, in the present embodiment, nitrogen gas is used as the carrier gas 64 and nitrogen gas is used as the diluent gas 66.

As shown in FIG. 1, the substrate 70 is firstly set on the substrate stage 13 in the furnace 12. Here, the substrate 70 is set on the substrate stage 13 in an orientation that allows the (010) crystal plane of the substrate 70 to be an upper surface (a surface exposed to the mist 62). Next, the substrate 70 is heated by the heater 14. Here, a temperature of the substrate 70 is controlled to, for example, 400 to 1000° C. When the temperature of the substrate 70 has stabilized, the mist supply device 20 is activated. In other words, the ultrasonic transducer 24 is activated so as to create the mist 62 of the material solution 60 in the container 22. Simultaneously, the carrier gas 64 is introduced from the carrier gas introduction path 28 into the container 22, and the diluent gas 66 is introduced from the diluent gas introduction path 30 into the mist supply path 26. Here, a total flow rate of the carrier gas 64 and the diluent gas 66 is set to approximately 5 L/min. The carrier gas 64 passes through the container 22, and as shown by an arrow 44, flows into the mist supply path 26. At this occasion, the mist 62 in the container 22 flows into the mist supply path 26 with the carrier gas 64. Moreover, the diluent gas 66 is mixed with the mist 62 in the mist supply path 26. The mist 62 is thereby diluted. The mist 62, together with the nitrogen gas (i.e., the carrier gas 64 and the diluent gas 66), flows downstream in the mist supply path 26, and as shown by an arrow 48, flows from the mist supply path 26 into the furnace 12. In the furnace 12, the mist 62 flows toward the downstream end 12b with the nitrogen gas, and is discharged to the exhaust pipe 80.

A part of the mist 62 flowing in the furnace 12 adheres to the surface of the substrate 70 that is heated. A chemical reaction of the mist 62 (i.e., the material solution 60) then occurs on the substrate 70. Consequently, gallium oxide (more specifically, β-gallium oxide (β-Ga$_2$O$_3$)) is created on the substrate 70. The mist 62 is continuously supplied to the surface of the substrate 70, so that a gallium oxide film is grown on the surface of the substrate 70.

Figure 2:
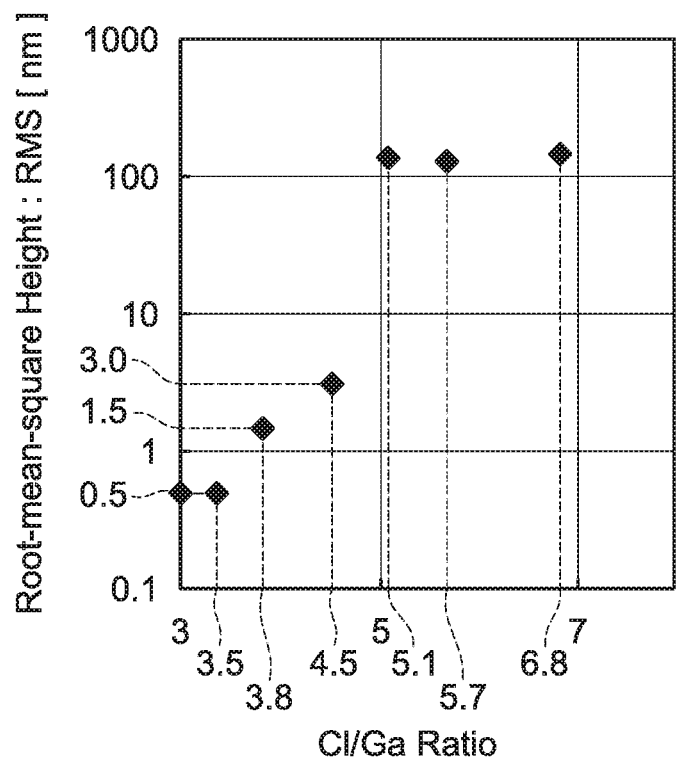
FIG. 2 is a graph showing a relation between a root-mean-square (RMS) height of a gallium oxide film and a Cl/Ga ratio.

FIG. 2 shows a result of an experiment that examined a relation between a surface roughness (more specifically, a root-mean-square (RMS) height) of a gallium oxide film formed by the above-mentioned film formation method and a Cl/Ga ratio in the material solution. The Cl/Ga ratio is a value obtained by dividing the molar concentration of chlorine in the material solution by the molar concentration of gallium in the material solution. As shown in FIG. 2, it was found that within a range from 5.1 to 6.8 of the Cl/Ga ratio, the gallium oxide film has a surface roughness of approximately 100 nm, whereas within a range from 3.0 to 4.5 of the Cl/Ga ratio, the gallium oxide film has the surface roughness equal to or less than 3.0 nm, which is remarkably decreased. It was found that within a range from 3.0 to 3.5 of the Cl/Ga ratio in particular, the gallium oxide film has the surface roughness of approximately 0.5 nm, which is further decreased.

As described above, regulating the Cl/Ga ratio of the material solution within the range from 3.0 to 4.5 can remarkably improve the surface roughness of the gallium oxide film. Regulating the Cl/Ga ratio of the material solution within the range from 3.0 to 3.5, in particular, enables the gallium oxide film to have an especially small surface roughness. According to the film formation method in the embodiment, therefore, a high-quality semiconductor device can be manufactured with use of a gallium oxide film.

Moreover, in the above-mentioned embodiment, the β-gallium oxide film is homoepitaxially grown on the substrate 70 constituted of β-gallium oxide, so that a high-quality β-gallium oxide film can be formed. Moreover, adopting the homoepitaxial growth also facilitates control of electrical conductivity.

Although the gallium oxide film is grown on the (010) crystal plane of the substrate 70 constituted of β-gallium oxide in the above-mentioned embodiment, the gallium oxide film may also be grown on another crystal plane (e.g., a (−201) crystal plane or the like). Moreover, although the substrate 70 is constituted of β-gallium oxide in the above-mentioned embodiment, the substrate 70 may also be constituted of gallium oxide of another type (e.g., α-, γ-, δ-, ε-, or another gallium oxide). Moreover, although the substrate 70 is constituted of gallium oxide in the above-mentioned embodiment, the substrate 70 may also be constituted of another material (e.g., sapphire, gallium nitride, or the like).

Moreover, although nitrogen is used as the carrier gas 64 and as the diluent gas 66 in the above-mentioned embodiment, another gas such as an inert gas can be used as the carrier gas 64 and as the diluent gas 66.

Some of the technical features disclosed herein will be listed as below. It should be noted that the respective technical elements are independent of one another, and are useful solely or in combinations.

In an example of the film formation method disclosed herein, the molar concentration of chlorine in the material solution may be equal to or less than 3.5 times the molar concentration of gallium in the material solution.

According to this film formation method, the gallium oxide film having a smoother surface can be formed.

In an example of the film formation method disclosed herein, the substrate may be constituted of β-gallium oxide.

According to this configuration, the gallium oxide film having a smoother surface can be formed.

In an example of the film formation method disclosed herein, gallium chloride may be dissolved in water so as to create the material solution. In this case, hydrochloric acid may be mixed with the water.

In another example of the film formation method disclosed herein, gallium may be dissolved in hydrochloric acid so as to create the material solution.

In another example of the film formation method disclosed herein, gallium hydroxide may be dissolved in hydrochloric acid so as to create the material solution.

In another example of the film formation method disclosed herein, gallium oxyhydroxide may be dissolved in hydrochloric acid so as to create the material solution.

While specific examples of the present disclosure have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present disclosure is not limited to the combinations described at the time the claims are filed. Further, the purpose of the examples illustrated by the present description or drawings is to satisfy multiple objectives simultaneously, and satisfying any one of those objectives gives technical utility to the present disclosure.

What is claimed is:

1. A method of forming a gallium oxide film, the method comprising dissolving gallium oxyhydroxide in hydrochloric acid to create a material solution comprising gallium atoms and chlorine atoms, supplying a mist of the material solution to a surface of a substrate while heating the substrate so as to form the gallium oxide film on the surface of the substrate, wherein a molar concentration of chlorine in the material solution is 3.0 times to 4.5 times a molar concentration of gallium in the material solution.

2. The method of claim 1, wherein the molar concentration of chlorine in the material solution is equal to or less than 3.5 times the molar concentration of gallium in the material solution.

3. The method of claim 1, wherein the substrate is constituted of β-gallium oxide.

4. The method of claim 1, further comprising dissolving gallium chloride in water so as to create the material solution.

5. The method of claim 4, wherein the creation of the material solution comprises mixing hydrochloric acid with the water.

6. The method of claim 1, further comprising dissolving gallium in hydrochloric acid so as to create the material solution.

7. The method of claim 1, further comprising dissolving gallium hydroxide in hydrochloric acid so as to create the material solution.

* * * * *